US011532588B2

(12) United States Patent
Nakako et al.

(10) Patent No.: US 11,532,588 B2
(45) Date of Patent: *Dec. 20, 2022

(54) COPPER PASTE FOR PRESSURELESS BONDING, BONDED BODY AND SEMICONDUCTOR DEVICE

(71) Applicant: Showa Denko Materials Co., Ltd., Tokyo (JP)

(72) Inventors: Hideo Nakako, Tokyo (JP); Kazuhiko Kurafuchi, Tokyo (JP); Yoshinori Ejiri, Tokyo (JP); Dai Ishikawa, Tokyo (JP); Chie Sugama, Tokyo (JP); Yuki Kawana, Tokyo (JP)

(73) Assignee: SHOWA DENKO MATERIALS CO., LTD., Tokyo (JP)

( * ) Notice: Subject to any disclaimer, the term of this patent is extended or adjusted under 35 U.S.C. 154(b) by 59 days.

This patent is subject to a terminal disclaimer.

(21) Appl. No.: 17/153,993

(22) Filed: Jan. 21, 2021

(65) Prior Publication Data

US 2021/0143121 A1 May 13, 2021

Related U.S. Application Data

(63) Continuation of application No. 16/476,969, filed as application No. PCT/JP2017/000654 on Jan. 11, 2017, now Pat. No. 10,930,612.

(51) Int. Cl.
*H01L 23/00* (2006.01)
*C09D 1/00* (2006.01)
*C09D 5/24* (2006.01)

(52) U.S. Cl.
CPC ........... *H01L 24/29* (2013.01); *C09D 1/00* (2013.01); *C09D 5/24* (2013.01); *H01L 24/83* (2013.01);
(Continued)

(58) Field of Classification Search
CPC ............ H01L 24/29; H01L 24/83; H01L 2224/29247; H01L 2224/8384; H01L 2924/35121
See application file for complete search history.

(56) References Cited

U.S. PATENT DOCUMENTS

| 8,022,551 B2 * | 9/2011 | Soga ............... H01L 23/49513 257/772 |
| 2005/0176882 A1 * | 8/2005 | Arifuku ............... H05K 3/323 524/731 |

(Continued)

FOREIGN PATENT DOCUMENTS

| CN | 102812520 A | 12/2012 |
| EP | 2549488 A | 1/2013 |

(Continued)

OTHER PUBLICATIONS

R. Khazaka, L. Mendizabal, D. Henry, "Review on Joint Shear Strength of Nano-Silver Pasteand Its Long-Term High Temperature Reliability", J. ElecTron. Mater, 43(7), 2014, p. 2459-p. 2466.

*Primary Examiner* — Nathan W Ha
(74) *Attorney, Agent, or Firm* — Fitch, Even, Tabin & Flannery, LLP

(57) ABSTRACT

A copper paste for pressureless bonding is a copper paste for pressureless bonding, containing: metal particles; and a dispersion medium, in which the metal particles include sub-micro copper particles having a volume average particle diameter of greater than or equal to 0.01 μm and less than or equal to 0.8 μm, and micro copper particles having a volume average particle diameter of greater than or equal to 2.0 μm and less than or equal to 50 μm, and the dispersion medium contains a solvent having a boiling point of higher than or equal to 300° C., and a content of the solvent having a boiling point of higher than or equal to 300° C. is greater (Continued)

than or equal to 2 mass % on the basis of a total mass of the copper paste for pressureless bonding.

7 Claims, 6 Drawing Sheets

(52) U.S. Cl.
CPC ............... *H01L 2224/29247* (2013.01); *H01L 2224/8384* (2013.01); *H01L 2924/35121* (2013.01)

(56) References Cited

U.S. PATENT DOCUMENTS

| | | | | |
|---|---|---|---|---|
| 2007/0164260 | A1* | 7/2007 | Kuwajima | H05K 1/095 |
| | | | | 252/512 |
| 2008/0173398 | A1* | 7/2008 | Yasuda | H01L 24/40 |
| | | | | 156/326 |
| 2010/0285305 | A1* | 11/2010 | Akutsu | H01L 24/32 |
| | | | | 428/323 |
| 2012/0103515 | A1* | 5/2012 | Endoh | B23K 35/40 |
| | | | | 156/325 |
| 2013/0186675 | A1 | 7/2013 | Takahashi | |
| 2015/0069638 | A1* | 3/2015 | Hiratsuka | B23K 35/3033 |
| | | | | 257/784 |
| 2015/0243626 | A1* | 8/2015 | Sato | H01L 24/27 |
| | | | | 156/219 |
| 2016/0368103 | A1* | 12/2016 | Shearer | B23K 35/262 |
| 2017/0144221 | A1* | 5/2017 | Ghoshal | B23K 3/0607 |
| 2017/0162537 | A1* | 6/2017 | Fathi | B41J 2/17559 |
| 2017/0210947 | A1* | 7/2017 | Yamada | H01L 24/83 |
| 2018/0006002 | A1* | 1/2018 | Tsai | H01L 24/75 |
| 2018/0358318 | A1* | 12/2018 | Shearer | B23K 35/26 |
| 2020/0075528 | A1* | 3/2020 | Kawana | B22F 7/064 |
| 2020/0176411 | A1* | 6/2020 | Kawana | B22F 7/064 |

FOREIGN PATENT DOCUMENTS

| | | |
|---|---|---|
| JP | 2008-146999 A | 6/2008 |
| JP | 4247800 B | 4/2009 |
| JP | 2011-114747 A | 9/2011 |
| JP | 2012-028243 A | 2/2012 |
| JP | 2013-039580 A | 2/2013 |
| JP | 2013-151591 A | 8/2013 |
| JP | 2013-541611 A | 11/2013 |
| JP | 2013-247060 A | 12/2013 |
| JP | 2014-077101 A | 5/2014 |
| JP | 2014-167145 A | 9/2014 |
| JP | 2014-210947 A | 11/2014 |
| JP | 2014-224296 A | 12/2014 |
| JP | 2015-011899 A | 1/2015 |
| JP | 2015-082385 A | 4/2015 |
| JP | 2015-133317 A | 7/2015 |
| JP | 2016-115560 A | 6/2016 |
| JP | 2017-103180 A | 6/2017 |
| JP | 7005121 B2 | 1/2022 |
| WO | 2011/114747 A1 | 9/2011 |
| WO | 2014/038331 A1 | 3/2014 |

* cited by examiner

COPPER PASTE FOR PRESSURELESS BONDING, BONDED BODY AND SEMICONDUCTOR DEVICE

CROSS-REFERENCE TO RELATED APPLICATION

This application is a continuation application of Ser. No. 16/476,969, filed Jul. 10, 2019, which is a U.S. national phase application filed under 35 U.S.C. § 371 of International Application No. PCT/JP2017/000654, filed Jan. 11, 2017, designating the United States, the content of each of which is hereby incorporated herein by reference in their entirety.

TECHNICAL FIELD

The present invention relates to a copper paste for pressureless bonding, and a bonded body and a semiconductor device using the copper paste for pressureless bonding.

BACKGROUND ART

When a semiconductor device is manufactured, various bonding materials are used in order to bond a semiconductor element and a lead frame or the like (a support member) together. In the semiconductor device, a high-melting point lead solder has been used as a bonding material for bonding a power semiconductor, an LSI, or the like that is operated at a high temperature of higher than or equal to 150° C. Recently, an operation temperature increases to be close to a melting point of the high-melting point lead solder, in accordance with higher capacity and space saving of the semiconductor element, and thus, it is difficult to ensure connection reliability. On the other hand, a bonding material not containing lead is obtained in accordance with tightening of RoHS regulation.

Until now, the bonding of a semiconductor element using materials other than the lead solder has been considered. For example, in Patent Literature 1 described below, a technology is proposed in which silver nanoparticles are sintered, and thus, a sintered silver layer is formed. It is known that such sintered silver has high connection reliability with respect to a power cycle (refer to Non Patent Literature 1).

A technology is also proposed in which copper particles are sintered as another material, and thus, a sintered copper layer is formed. For example, in Patent Literature 2 described below, a bonding material containing copper nanoparticles, and any one or both of copper micro particles and copper sub-micro particles is disclosed, and it is described that the bonding material is capable of bonding a member without a pressure.

CITATION LIST

Patent Literature

Patent Literature 1: Japanese Patent No. 4247800
Patent Literature 2: Japanese Unexamined Patent Publication No. 2014-167145

Non Patent Literature

Non Patent Literature 1: R. Khazaka, L. Mendizabal, D. Henry: J. ElecTron. Mater, 43(7), 2014, 2459-2466

SUMMARY OF INVENTION

Technical Problem

In a method described in Patent Literature 1 described above, the densification of the sintered silver layer is essential in order to obtain high connection reliability, and thus, a thermal compression bonding process accompanying pressurization is necessary. In the case of performing the thermal compression bonding process accompanying pressurization, there is a problem such as a decrease in a production efficiency and a decrease in a yield ratio. Further, in the case of using the silver nanoparticles, there is a problem such as a considerable increase in a material cost due to silver.

In a method described in Patent Literature 2 described above, sintering is performed without a pressure, but the method is not yet sufficient for practical use in the following points. That is, it is necessary that the surfaces of the copper nanoparticles are modified with a protective agent in order to suppress oxidization and to improve dispersibility, but the copper nanoparticles has a large specific surface area, and thus, in a bonding material containing the copper nanoparticles as a main component, a compounded amount of the surface protective agent tends to increase. In addition, a compounded amount of a dispersion medium tends to increase in order to ensure the dispersibility. For this reason, in the bonding material in Patent Literature 2 described above, the ratio of the surface protective agent or the dispersion medium increases in order for feed stability of storage or coating, and thus, volume contraction at the time of performing the sintering tends to easily increase, a denseness after the sintering is performed tends to easily decrease, and it is difficult to ensure a sintered body strength.

In addition, the pressureless bonding using the bonding material is excellently performed in a case where materials of members to be bonded together are equal or close to each other, but a bonding force easily greatly decreases in a case where the materials of the members to be bonded together are different from each other. According to the consideration of the present inventors, for example, it has been determined that in a case where a copper plate containing copper on a covered surface, and a copper block containing nickel on a covered surface are bonded together, and in a case where a copper plate containing copper on a covered surface, and a silicon chip containing nickel on a covered surface are bonded together, there is a case where a bonding strength of the latter greatly decreases in accordance with the composition of a copper paste for bonding, in a pressureless sintering condition. That is, in a case where members having different thermal expansion rates are bonded together without a pressure, as with the copper block and the silicon chip, there is a case where a bonding defect occurs.

An object of the present invention is to provide a copper paste for pressureless bonding in which a sufficient bonding strength can be obtained even in a case where members having different thermal expansion rates are bonded together without a pressure. Another object of the present invention is to provide a bonded body and a semiconductor device using the copper paste for pressureless bonding, and a manufacturing method thereof.

Solution to Problem

In order to attain the objects described above, the present inventors have considered the followings. First, in bonding using a copper paste for bonding, when a temperature rises in a drying step or a sintering step in the bonding, a dispersion medium is volatilized, and then, a sediment of dried copper-based particles remains. The sediment of the dried copper-based particles has no bonding force between the particles, such as an aggregation force of the dispersion medium, and thus, is in an extremely vulnerable state. At this time, in a case where materials of members to be bonded together are different from each other, it is considered that a shear force due to a thermal expansion rate difference acts between the members to be bonded together, in accordance with a temperature difference between a room temperature and a drying step temperature, or a temperature difference between a room temperature and a sintering step temperature, and a sediment layer of the copper-based particles is easily peeled off. In a case where the member is actively pressurized in the sintering step, the peeling is crushed, and a sinter of the sediment of the copper-based particles and the member are bonded together, but in the case of a pressureless state, there is a possibility that the peeled-off state remains. From the viewpoint of suppressing such peeling, controlling the state of the sediment when a temperature rises has been considered, and thus, it has been found that a sufficient bonding strength can be obtained by using a specific solvent at a specific ratio as the dispersion medium even in a case where members having different thermal expansion rates are bonded together without a pressure, and the present invention has been completed.

The present invention provides a copper paste for pressureless bonding, containing: metal particles; and a dispersion medium, in which the metal particles include sub-micro copper particles having a volume average particle diameter of greater than or equal to 0.01 µm and less than or equal to 0.8 µm, and micro copper particles having a volume average particle diameter of greater than or equal to 2.0 µm and less than or equal to 50 µm, and the dispersion medium contains a solvent having a boiling point of higher than or equal to 300° C., and a content of the solvent having a boiling point of higher than or equal to 300° C. is greater than or equal to 2 mass % on the basis of a total mass of the copper paste for pressureless bonding.

Herein, "pressureless" indicates a state of receiving self-weight of a member to be bonded, or a pressure of less than or equal to 0.01 MPa in addition to the self-weight.

In addition, the present invention provides a copper paste for pressureless bonding, containing: metal particles; and a dispersion medium, in which the metal particles include sub-micro copper particles having a volume average particle diameter of greater than or equal to 0.01 µm and less than or equal to 0.8 µm, and micro copper particles having a volume average particle diameter of greater than or equal to 2.0 µm and less than or equal to 50 µm, and the dispersion medium contains a solvent having a boiling point of higher than or equal to 300° C., and a content of the solvent having a boiling point of higher than or equal to 300° C. is greater than or equal to 8 volume % on the basis of a total volume of the copper paste for pressureless bonding.

According to the copper paste for pressureless bonding of the present invention, even in a case where members having different thermal expansion rates are bonded together without a pressure, it is possible to obtain a sufficient bonding strength. The present inventors have conjectured the reason that such an effect is obtained as follows. That is, it is considered that the dispersion medium contains the solvent having a boiling point of higher than or equal to 300° C. at a specific amount, and thus, when a temperature rises in the bonding, a predetermined amount of the solvent having a boiling point of higher than or equal to 300° C. is capable of remaining in the copper paste between the members. It is considered that such a remaining solvent applies flexibility and adhesive properties to the copper paste, and thus, even in a case where a shear force due to a thermal expansion rate difference acts, the copper paste between the members is deformable and followable, and each the members can be bonded without peeling.

In the present invention, the solvent having a boiling point of higher than or equal to 300° C. may have at least one type of group selected from the group consisting of a hydroxy group, an ether group, and an ester group. In a case where the copper paste for pressureless bonding contains such a solvent, a surface treatment agent having a close Hansen solubility parameter, such as an organic acid, organic amine, a hydroxyl group-containing polymer, and polyvinyl pyrrolidone, can be used.

In the copper paste for pressureless bonding of the present invention, when the copper paste for pressureless bonding that exists between two members is heated at a temperature of higher than or equal to 250° C. and lower than 350° C., the micro copper particles and the sub-micro copper particles may be sintered, metal bonding may be formed, and the two members may be bonded together at a die shear strength of greater than or equal to 10 MPa and a thermal conductivity of greater than or equal to 100 W/(m·K). According to such a copper paste for pressureless bonding, when members having different thermal expansion rates are bonded together, a sufficient bonding strength is easily obtained.

In the copper paste for pressureless bonding of the present invention, the content of the solvent having a boiling point of higher than or equal to 300° C. that remains when a temperature rises to 300° C. from 25° C. may be greater than or equal to 1 mass % on the basis of a mass of the copper paste for pressureless bonding when a temperature rises to 300° C. In this case, the flexibility of the copper paste composition for pressureless bonding is easily maintained, and in a case where the members having different thermal expansion rates are bonded together, the copper paste for pressureless bonding is easily deformable and followable with respect to the member, and thus, a bonding strength tends to be easily improved.

In addition, the present invention provides a bonded body, including: a first member; a second member having a thermal expansion rate different from that of the first member; and a sintered body of the copper paste for pressureless bonding described above, the sintered body bonding the first member and the second member together.

According to the bonded body of the present invention, the bonding is performed by the sintered body of the copper paste for pressureless bonding described above, and thus, even in the case of the members having different thermal expansion rates, it is possible to obtain a bonded body in which the members are bonded together with a sufficient bonding strength.

In addition, the present invention provides a manufacturing method of a bonded body, including: a step of preparing a laminated body in which a first member, the copper paste for pressureless bonding described above, and a second member having a thermal expansion rate different from that of the first member are laminated in this order in a direction side in which self-weight of the first member acts, and of sintering the copper paste for pressureless bonding in a state of receiving the self-weight of the first member, or the self-weight of the first member and a pressure of less than or equal to 0.01 MPa.

According to the manufacturing method of a bonded body of the present invention, even in the case of the members having different thermal expansion rates, the members are bonded together with a sufficient bonding force by using the copper paste for pressureless bonding of the present invention described above, and thus, it is possible to manufacture a bonded body excellent in connection reliability.

In addition, the present invention provides a semiconductor device, including: a first member; a second member having a thermal expansion rate different from that of the first member; and a sintered body of the copper paste for pressureless bonding described above, the sintered body bonding the first member and the second member together, in which at least one of the first member and the second member is a semiconductor element.

According to a manufacturing method of a semiconductor device of the present invention, even in a case where members configuring the semiconductor device have different thermal expansion rates, the members are bonded together with a sufficient bonding force by using the copper paste for pressureless bonding of the present invention described above, and thus, it is possible to manufacture a semiconductor device excellent in connection reliability.

Advantageous Effects of Invention

The present invention is capable of providing a copper paste for pressureless bonding in which a sufficient bonding strength can be obtained even in a case where members having different thermal expansion rates are bonded together without a pressure. Further, the present invention is capable of providing a bonded body and a semiconductor device using the copper paste for pressureless bonding, and a manufacturing method thereof.

DESCRIPTION OF EMBODIMENTS

Figure 1:
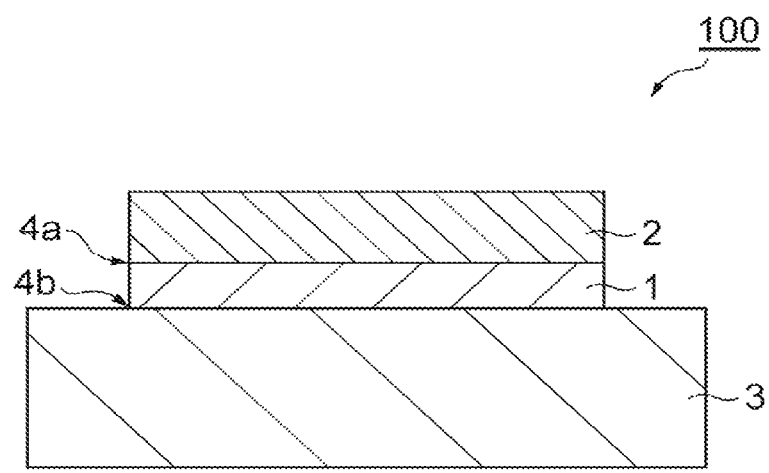
FIG. 1 is a schematic sectional view illustrating an example of a bonded body that is manufactured by using a copper paste for pressureless bonding of this embodiment.

Hereinafter, modes for carrying out the present invention (hereinafter, referred to as "this embodiment") will be described in detail. The present invention is not limited to the following embodiment.

<Copper Paste for Pressureless Bonding>

A copper paste for pressureless bonding of this embodiment is a copper paste for pressureless bonding containing metal particles, and a dispersion medium, and the metal particles include sub-micro copper particles and micro copper particles.

(Metal Particles)

Examples of the metal particles according to this embodiment include sub-micro copper particles, micro copper particles, and metal particles other than such copper particles.

(Sub-Micro Copper Particles)

The sub-micro copper particles may be copper particles having sintering properties at a temperature range of higher than or equal to 250° C. and lower than or equal to 350° C. Examples of the sub-micro copper particles include copper particles having a particle diameter of greater than or equal to 0.01 μm and less than or equal to 0.8 μm, and for example, copper particles of copper particles having a volume average particle diameter of greater than or equal to 0.01 μm and less than or equal to 0.8 μm can be used. In a case where the volume average particle diameter of the sub-micro copper particles is greater than or equal to 0.01 μm, an effect such as suppression in a synthesis cost of the sub-micro copper particles, excellent dispersibility, and suppression in a used amount of a surface treatment agent is easily obtained. In a case where the volume average particle diameter of the sub-micro copper particles is less than or equal to 0.8 μm, an effect such as excellent sintering properties of the sub-micro copper particles is easily obtained. From the viewpoint of further obtaining the effects described above, an upper limit of the volume average particle diameter of the sub-micro copper particles may be less than or equal to 0.6 μm, may be less than or equal to 0.5 μm, or may be less than or equal to 0.4 μm. In addition, a lower limit of the volume average particle diameter of the sub-micro copper particles may be greater than or equal to 0.02 μm, may be greater than or equal to 0.05 μm, or may be greater than or equal to 0.1 μm. The volume average particle diameter of the sub-micro copper particles, for example, may be greater than or equal to 0.01 μm and less than or equal to 0.5 μm, may be greater than or equal to 0.12 μm and less than or equal to 0.8 μm, may be greater than or equal to 0.15 μm and less than or equal to 0.8 μm, may be greater than or equal to 0.15 μm and less than or equal to 0.6 μm, may be greater than or equal to 0.2 μm and less than or equal to 0.5 μm, or may be greater than or equal to 0.3 μm and less than or equal to 0.45 μm.

Furthermore, herein, the volume average particle diameter indicates a 50% volume average particle diameter. In the case of obtaining the volume average particle diameter of the copper particles, the volume average particle diameter of the copper particles can be obtained by a method of dispersing copper particles to be a raw material, or dried copper particles in which a volatile component is removed from the copper paste for pressureless bonding in a dispersion medium by using a dispersant, and of performing measurement with a light scattering method particle size distribution measurement device (for example, SHIMADZU nanoparticles size distribution measurement device (SALD-7500nano, manufactured by SHIMADZU CORPORATION)), or the like. In the case of using the light scattering method particle size distribution measurement device, hexane, toluene, α-terpineol, 4-methyl-1,3-dioxolan-2-one, and the like can be used as the dispersion medium.

The content of the sub-micro copper particles may be greater than or equal to 20 mass % and less than or equal to 90 mass %, may be greater than or equal to 30 mass % and less than or equal to 90 mass %, may be greater than or equal to 35 mass % and less than or equal to 85 mass %, or may be greater than or equal to 40 mass % and less than or equal to 80 mass %, on the basis of the total mass of the metal particles. In a case where the content of the sub-micro copper particles is within the range described above, it is easy to ensure a bonding strength of a bonded body that is manufactured by sintering the copper paste for pressureless bonding, and in a case where the copper paste for pressureless bonding is used for bonding a semiconductor element, a semiconductor device tends to exhibit an excellent die shear strength and excellent connection reliability.

It is preferable that the content of the sub-micro copper particles is greater than or equal to 20 mass % and less than or equal to 90 mass % on the basis of the total mass of the mass of the sub-micro copper particles and the mass of the micro copper particles. In a case where the content of the sub-micro copper particles is greater than or equal to 20 mass %, it is possible to sufficiently fill between the micro copper particles, and it is easy to ensure the bonding strength of the bonded body that is manufactured by sintering the copper paste for pressureless bonding, and in a case where the copper paste for pressureless bonding is used for bonding the semiconductor element, the semiconductor device tends to exhibit an excellent die shear strength and excellent connection reliability. In a case where the content of the sub-micro copper particles is less than or equal to 90 mass %, volume contraction at the time of sintering the copper paste for pressureless bonding can be sufficiently suppressed, and thus, it is easy to ensure the bonding strength of the bonded body that is manufactured by sintering the copper paste for pressureless bonding, and in a case where the copper paste for pressureless bonding is used for bonding the semiconductor element, the semiconductor device tends to exhibit an excellent die shear strength and excellent connection reliability. From the viewpoint of further obtaining the effects described above, the content of the sub-micro copper particles may be greater than or equal to 30 mass % and less than or equal to 85 mass %, may be greater than or equal to 35 mass % and less than or equal to 85 mass %, or may be greater than or equal to 40 mass % and less than or equal to 80 mass %, on the basis of the total mass of the mass of the sub-micro copper particles and the mass of the micro copper particles.

The shape of the sub-micro copper particles is not particularly limited. Examples of the shape of the sub-micro copper particles include a spherical shape, a massive shape, a needle-like shape, a flake-like shape, an approximately spherical shape, and an aggregate thereof. The shape of the sub-micro copper particles may be a spherical shape, an approximately spherical shape, or a flake-like shape from the viewpoint of dispersibility and filling properties, and may be a spherical shape or an approximately spherical shape from the viewpoint of combustion properties, dispersibility, mixing properties with respect to flake-like micro particles. Herein, the "flake-like shape" includes a flat plate-like shape such as a plate-like shape and a scale-like shape.

An aspect ratio of the sub-micro copper particles may be less than or equal to 5, or may be less than or equal to 3, from the viewpoint of the dispersibility, the filling properties, and the mixing properties with respect to the flake-like micro particles. Herein, the "aspect ratio" indicates Long Side/Thickness of the particles. The long side and the thickness of the particles can be measured, for example, from an SEM image of the particles.

The sub-micro copper particles may be treated with a specific surface treatment agent. Examples of the specific surface treatment agent include an organic acid having 2 to 18 carbon atoms. Examples of the organic acid having 2 to 18 carbon atoms include a saturated aliphatic acid such as an acetic acid, a propanoic acid, a butanoic acid, a pentanoic acid, a hexanoic acid, a heptanoic acid, a caprylic acid, methyl heptanoate, ethyl hexanoate, propyl pentanoate, a pelargonic acid, methyl octanoate, ethyl heptanoate, propyl hexanoate, a capric acid, methyl nonanoate, ethyl octanoate, propyl heptanoate, butyl hexanoate, an undecanoic acid, methyl decanoate, ethyl nonanoate, propyl octanoate, butyl heptanoate, a lauric acid, methyl undecanoate, ethyl decanoate, propyl nonanoate, butyl octanoate, pentyl heptanoate, a tridecanoic acid, methyl dodecanoate, ethyl undecanoate, propyl decanoate, butyl nonanoate, pentyl octanoate, a myristic acid, methyl tridecanoate, ethyl dodecanoate, propyl undecanoate, butyl decanoate, pentyl nonanoate, hexyl octanoate, a pentadecanoic acid, methyl tetradecanoate, ethyl tridecanoate, propyl dodecanoate, butyl undecanoate, pentyl decanoate, hexyl nonanoate, a palmitic acid, methyl pentadecanoate, ethyl tetradecanoate, propyl tridecanoate, butyl dodecanoate, pentyl undecanoate, hexyl decanoate, heptyl nonanoate, a heptadecanoic acid, an octadecanoic acid, methyl cyclohexane carboxylate, ethyl cyclohexane carboxylate, propyl cyclohexane carboxylate, butyl cyclohexane carboxylate, pentyl cyclohexane carboxylate, hexyl cyclohexane carboxylate, heptyl cyclohexane carboxylate, octyl cyclohexane carboxylate, and nonyl cyclohexane carboxylate; unsaturated aliphatic acid such as octenoic acid, a nonenoic acid, methyl nonenoate, a decenoic acid, an undecenoic acid, a dodecenoic acid, a tridecenoic acid, a tetradecenoic acid, a myristoleic acid, a pentadecenoic acid, a hexadecenoic acid, a palmitoleic acid, a sapienic acid, an oleic acid, a vaccenic acid, a linoleic acid, a linolenic acid, and a linolenic acid; and an aromatic carboxylic acid such as a terephthalic acid, a pyromellitic acid, o-phenoxy benzoate, methyl benzoate, ethyl benzoate, propyl benzoate, butyl benzoate, pentyl benzoate, hexyl benzoate, heptyl benzoate, octyl benzoate, and nonyl benzoate. Only one type of such organic acids may be used, or two or more types thereof may be used by being combined. Such an organic acid and the sub-micro copper particles described above are combined, and thus, the dispersibility of the sub-micro copper particles and desorbing properties of the organic acid at the time of performing the sintering tend to be compatible.

A treatment amount of the surface treatment agent may be an amount to be attached onto the surface of the sub-micro copper particles in an one-molecule layer to a three-molecule layer. The amount is the number (n) of molecule layers attached onto the surface of the sub-micro copper particles, and can be calculated from a specific surface area ($A_p$) (the unit of m$^2$/g) of the sub-micro copper particles, a molecular weight ($M_s$) (the unit of g/mol) of the surface treatment agent, a minimum cover area ($S_S$) (the unit of m$^2$/item) of the surface treatment agent, and Avogadro's number ($N_A$) ($6.02\times10^2$ items). Specifically, the treatment amount of the surface treatment agent is calculated in accordance with an expression of Treatment Amount (Mass %) of Surface Treatment Agent=$\{(n \cdot A_p \cdot M_s)/(S_S \cdot N_A + n \cdot A_p \cdot M_s)\} \times 100\%$.

The specific surface area of the sub-micro copper particles can be calculated by measuring the dried sub-micro copper particles with a BET specific surface area measurement method. In a case where the surface treatment agent is a linear-chain saturated aliphatic acid, the minimum cover area of the surface treatment agent is $2.05\times10^{-19}$ m$^2$/1 molecule. In other surface treatment agents, for example, the minimum cover area of the surface treatment agent can be measured by calculation from a molecular model or a method described in "Chemistry and Education" (Katsuhiro UEDA, Sumio INAFUKU, and Iwao MORI, 40(2), 1992, p 114-117). An example of a quantitative determination method of the surface treatment agent will be described. The surface treatment agent can be identified by thermal desorption gas of a dried powder in which the dispersion medium is removed from the copper paste for pressureless bonding, and a gas chromatograph mass analyzer, and thus, it is possible to determine the number of carbon atoms and a molecular weight of the surface treatment agent. A carbon content ratio of the surface treatment agent can be analyzed by carbon content analysis. Examples of a carbon content analysis method include a high-frequency induction heating furnace combustion/infrared ray absorption method. The amount of the surface treatment agent can be calculated by the following expression from the number of carbon atoms, the molecular weight, and the carbon content ratio of the identified surface treatment agent.

The treatment amount of the surface treatment agent described above may be greater than or equal to 0.07 mass % and less than or equal to 2.1 mass %, may be greater than or equal to 0.10 mass % and less than or equal to 1.6 mass %, or may be greater than or equal to 0.2 mass % and less than or equal to 1.1 mass %.

The sub-micro copper particles have excellent sintering properties, and thus, it is possible to reduce problems such as an expensive synthesis cost, poor dispersibility, and a decrease in volume contraction after the sintering is performed, that occur in a bonding material mainly using copper nanoparticles.

Commercially available sub-micro copper particles can be used as the sub-micro copper particles according to this embodiment. Examples of the commercially available sub-micro copper particles include CH-0200 (manufactured by MITSUI MINING & SMELTING CO., LTD., a volume average particle diameter of 0.36 μm), HT-14 (manufactured by MITSUI MINING & SMELTING CO., LTD., a volume average particle diameter of 0.41 μm), CT-500 (manufactured by MITSUI MINING & SMELTING CO., LTD., a volume average particle diameter of 0.72 μm), and Tn-Cu100 (manufactured by TAIYO NIPPON SANSO CORPORATION, a volume average particle diameter of 0.12 μm).

(Micro Copper Particles)

Copper particles having a particle diameter of greater than or equal to 2.0 μm and less than or equal to 50 μm can be used as the micro copper particles, and for example, copper particles having a volume average particle diameter of greater than or equal to 2.0 μm and less than or equal to 50 μm can be used. In a case where the volume average particle diameter of the micro copper particles is within the range described above, it is possible to sufficiently reduce the volume contraction at the time of sintering the copper paste for pressureless bonding, the generation of voids, and the like, and it is easy to ensure the bonding strength of the bonded body that is manufactured by sintering the copper paste for pressureless bonding, and in a case where the copper paste for pressureless bonding is used for bonding the semiconductor element, the semiconductor device tends to exhibit an excellent die shear strength and excellent connection reliability. From the viewpoint of further obtaining the effects described above, the volume average particle diameter of the micro copper particles may be greater than or equal to 2 μm and less than or equal to 20 μm, may be greater than or equal to 2 μm and less than or equal to 10 μm, may be greater than or equal to 3 μm and less than or equal to 20 μm, or may be greater than or equal to 3 μm and less than or equal to 10 μm.

The content of the micro copper particles may be greater than or equal to 10 mass % and less than or equal to 90 mass %, may be greater than or equal to 15 mass % and less than or equal to 65 mass %, or may be greater than or equal to 20 mass % and less than or equal to 60 mass %, on the basis of the total mass of the metal particles. In a case where the content of the micro copper particles is within the range described above, it is easy to ensure the bonding strength of the bonded body that is manufactured by sintering the copper paste for pressureless bonding, and in a case where the copper paste for pressureless bonding is used for bonding the semiconductor element, the semiconductor device tends to exhibit an excellent die shear strength and excellent connection reliability.

The total content of the content of the sub-micro copper particles and the content of the micro copper particles can be greater than or equal to 80 mass % on the basis of the total mass of the metal particles. In a case where the total content of the content of the sub-micro copper particles and the content of the micro copper particles is within the range described above, it is possible to sufficiently reduce the volume contraction at the time of sintering the copper paste for pressureless bonding, and it is easy to ensure the bonding strength of the bonded body that is manufactured by sintering the copper paste for pressureless bonding. In a case where the copper paste for pressureless bonding is used for bonding the semiconductor element, the semiconductor device tends to exhibit an excellent die shear strength and excellent connection reliability. From the viewpoint of further obtaining the effects described above, the total content of the content of the sub-micro copper particles and the content of the micro copper particles may be greater than or equal to 90 mass %, may be greater than or equal to 95 mass %, or may be 100 mass %, on the basis of the total mass of the metal particles.

The shape of the micro copper particles is not particularly limited. Examples of the shape of the micro copper particles include a spherical shape, a massive shape, a needle-like shape, a flake-like shape, an approximately spherical shape, and an aggregate thereof. Among them, the flake-like shape is preferable as the shape of the micro copper particles. By using flake-like micro copper particles, the micro copper particles in the copper paste for pressureless bonding are oriented to be approximately parallel to a bonding surface, and thus, it is possible to suppress the volume contraction at the time of sintering the copper paste for pressureless bonding, and it is easy to ensure the bonding strength of the bonded body that is manufactured by sintering the copper paste for pressureless bonding. In a case where the copper paste for pressureless bonding is used for bonding the semiconductor element, the semiconductor device tends to exhibit an excellent die shear strength and excellent connection reliability. From the viewpoint of further obtaining the effects described above, an aspect ratio of the flake-like micro copper particles may be greater than or equal to 4, or may be greater than or equal to 6.

In the micro copper particles, the presence or absence of the treatment with the surface treatment agent is not particularly limited. The micro copper particles may be treated with the surface treatment agent from the viewpoint of dispersion stability and oxidation resistance. The surface treatment agent may be removed at the time of performing the bonding. Examples of such a surface treatment agent include an aliphatic carboxylic acid such as a dodecanoic acid, a palmitic acid, a heptadecanoic acid, a stearic acid, an arachidic acid, a linoleic acid, a linolenic acid, and an oleic acid; an aromatic carboxylic acid such as a terephthalic acid, a pyromellitic acid, and o-phenoxy benzoate; aliphatic alcohol such as cetyl alcohol, stearyl alcohol, isobornyl cyclohexanol, and tetraethylene glycol; aromatic alcohol such as p-phenyl phenol; alkyl amine such as octyl amine, dodecyl amine, and stearyl amine; aliphatic nitrile such as stearonitrile and decane nitrile; a silane coupling agent such as alkyl alkoxy silane; and a polymer treatment agent such as polyethylene glycol, polyvinyl alcohol, polyvinyl pyrrolidone, and a silicone oligomer. Only one type of such surface treatment agents may be used, or two or more types thereof may be used by being combined.

The treatment amount of the surface treatment agent may be an amount corresponding to one molecule layer or more on a particle surface. The treatment amount of the surface treatment agent is changed in accordance with the specific surface area of the micro copper particles, the molecular weight of the surface treatment agent, and the minimum cover area of the surface treatment agent. In general, the treatment amount of the surface treatment agent may be greater than or equal to 0.001 mass %. The specific surface area of the micro copper particles, the molecular weight of the surface treatment agent, and the minimum cover area of the surface treatment agent can be calculated by the method described above.

In a case where the copper paste for pressureless bonding is prepared by using only the sub-micro copper particles described above, since volume contraction and sintering contraction due to the drying of the dispersion medium are large, the copper paste for bonding is easily peeled off from a covered surface at the time of performing the sintering, and in the bonding of the semiconductor element or the like, and it is difficult to obtain a sufficient die shear strength and sufficient connection reliability. In a case where the copper paste for pressureless bonding is prepared by using only the micro copper particles described above, a sintering temperature increases, and thus, a sintering step of higher than or equal to 400° C. tends to be required. The sub-micro copper particles and the micro copper particles are used together, and thus, the volume contraction at the time of sintering the copper paste for pressureless bonding is suppressed, and the bonded body is capable of having a sufficient bonding strength. In a case where the copper paste for pressureless bonding is used for bonding the semiconductor element, an effect that the semiconductor device exhibits an excellent die shear strength and excellent connection reliability is obtained.

Commercially available micro copper particles can be used as the micro copper particles according to this embodiment. Examples of the commercially available micro copper particles include MA-C025KFD (manufactured by MITSUI MINING & SMELTING CO., LTD., a volume average particle diameter of 7.5 µm), 3L3 (manufactured by Fukuda Metal Foil & Powder Co., Ltd., a volume average particle diameter of 8.0 µm), 1110F (manufactured by MITSUI MINING & SMELTING CO., LTD., a volume average particle diameter of 3.8 µm), and HWQ3.0 µm (manufactured by Fukuda Metal Foil & Powder Co., Ltd., a volume average particle diameter of 3.0 µm).

(Metal Particles Other than Copper Particles Described Above)

The metal particles may include metal particles other than the sub-micro copper particles and the micro copper particles, and for example, may include copper nanoparticles, and particles of nickel, silver, gold, palladium, platinum, or the like. A volume average particle diameter of the metal particles other than the copper particles may be greater than or equal to 0.01 µm and less than or equal to 10 µm, may be greater than or equal to 0.01 µm and less than or equal to 5 µm, or may be greater than or equal to 0.05 µm and less than or equal to 3 µm. In the case of including the other metal particles, the content may be less than 20 mass %, may be less than or equal to 10 mass %, on the basis of the total mass of the metal particles, from the viewpoint of obtaining a sufficient bonding properties. The other metal particles may not be included. The shape of the other metal particles is not particularly limited.

In the case of including the metal particles other than the copper particles, it is possible to obtain a sintered body in which a plurality of types of metals are dissolved or dispersed, and thus, mechanical properties such as a yield stress and a fatigue strength of the sintered body are improved, and the connection reliability is easily improved. In addition, a plurality of types of metal particles are added, and thus, the sintered body of the copper paste for pressureless bonding is capable of having a sufficient bonding strength with respect to a specific adherend. In a case where the copper paste for pressureless bonding is used for bonding the semiconductor element, the die shear strength and the connection reliability of the semiconductor device are easily improved.

(Dispersion Medium)

The dispersion medium contains a solvent having a boiling point of higher than or equal to 300° C. The boiling point of the solvent having a boiling point of higher than or equal to 300° C. may be higher than or equal to 300° C. and lower than or equal to 450° C., may be higher than or equal to 305° C. and lower than or equal to 400° C., or may be higher than or equal to 310° C. and lower than or equal to 380° C., from the viewpoint of rapidly evaporating and removing the solvent component at the time of reaching a bonding temperature, without hindering the sintering and densification, when the copper paste for pressureless bonding is sintered.

It is preferable that a structure having high affinity with respect to the surface of the metal particle surface is selected as the solvent having a boiling point of higher than or equal to 300° C. in order to improve the dispersibility of the metal particles to be included. In a case where the metal particles are subjected to a surface treatment with a surface treatment agent having an alkyl group, it is preferable that a solvent having an alkyl group is selected. Examples of such a solvent having a boiling point of higher than or equal to 300° C. include isobornyl cyclohexanol (MTPH, manufactured by Nippon Terpene Chemicals, Inc.), butyl stearate, EXCEPARL BS (manufactured by Kao Corporation), stearyl stearate, EXCEPARL SS (manufactured by Kao Corporation), 2-ethyl hexyl stearate, EXCEPARL EH-S (manufactured by Kao Corporation), isotridecyl stearate, EXCEPARL TD-S (manufactured by Kao Corporation), isooctadecanol, FINEOXOCOL 180 (manufactured by Nissan Chemical Corporation), FINEOXOCOL 180T (manufactured by Nissan Chemical Corporation), 2-hexyl decanol, FINEOXOCOL 1600 (manufactured by Nissan Chemical Corporation), tributyrin, tetraethylene glycol, heptadecane, octadecane, nonadecane, eicosane, heneicosane, docosane, methyl heptadecane, tridecyl cyclohexane, tetradecyl cyclohexane, pentadecyl cyclohexane, hexadecyl cyclohexane, undecyl benzene, dodecyl benzene, tetradecyl benzene, tridecyl benzene, pentadecyl benzene, hexadecyl benzene, heptadecyl benzene, nonyl naphthalene, diphenyl propane, octyl octanoate, methyl myristate, ethyl myristate, methyl linoleate, methyl stearate, triethylene glycol bis(2-ethyl hexanoate), tributyl citrate, pentyl phenol, dibutyl sebacate, oleyl alcohol, cetyl alcohol, methoxy phenethyl alcohol, benzyl phenol, hexadecanitrile, heptadecanitrile, benzyl benzoate, and cinmethylin.

It is preferable that a solvent having a Hansen solubility parameter close to that of the surface treatment agent is selected as the solvent having a boiling point of higher than or equal to 300° C., from the viewpoint of improving the dispersibility. An organic acid, organic amine, a hydroxyl group-containing polymer, polyvinyl pyrrolidone, and the like are easily handled as the surface treatment agent, and thus, it is preferable that the solvent having a boiling point of higher than or equal to 300° C. has at least one type of group selected from the group consisting of a hydroxy group, an ether group, and an ester group. The Hansen solubility parameter, for example, can be searched from a database at the end of the following published documents, or can be searched/calculated with a database and simulation integrated software HSPiP.

Published Document: "HANSEN SOLUBILITY PARAMETERS: A USER'S HANDBOOK" (CRC Press, 1999)

The content of the solvent having a boiling point of higher than or equal to 300° C. can be greater than or equal to 2 mass % on the basis of the total mass of the copper paste for pressureless bonding. The content of the solvent having a boiling point of higher than or equal to 300° C. may be greater than or equal to 2.2 mass %, or may be greater than or equal to 2.4 mass %, on the basis of the total mass of the copper paste for pressureless bonding. In a case where the content of the solvent having a boiling point of higher than or equal to 300° C. is within the range described above, it is possible for a certain amount of solvent to remain in the copper paste for pressureless bonding at the time of sintering the copper paste for pressureless bonding of this embodiment, it is easy to maintain flexibility and adhesive properties of the copper paste between members, and even in a case where the members to be used in the bonding have different thermal expansion rates, there is a tendency that the bonding can be performed without peeling. An upper limit of the content of the solvent having a boiling point of higher than or equal to 300° C. is not particularly limited. The content of the solvent having a boiling point of higher than or equal to 300° C. may be less than or equal to 9 mass % on the basis of the total mass of the copper paste for pressureless bonding, from the viewpoint of suppressing a time until the dispersion medium is removed at a sintering temperature, and of shortening a sintering time.

In addition, in the copper paste for pressureless bonding of this embodiment, the content of the solvent having a boiling point of higher than or equal to 300° C. may be greater than or equal to 8 volume %, may be greater than or equal to 17 volume %, or may be greater than or equal to 23 volume %, on the basis of the total volume of the copper paste for pressureless bonding. In a case where the content of the solvent having a boiling point of higher than or equal to 300° C. is within the range described above, it is possible for a certain amount of solvent to remain in the copper paste for pressureless bonding at the time of sintering the copper paste for pressureless bonding of this embodiment, it is easy to maintain the flexibility and the adhesive properties of the copper paste between the members, and even in a case where the members to be used in the bonding have different thermal expansion rates, there is a tendency that the bonding can be performed without peeling. The upper limit of the content of the solvent having a boiling point of higher than or equal to 300° C. is not particularly limited. The content of the solvent having a boiling point of higher than or equal to 300° C. may be less than or equal to 60 volume % on the basis of the total volume of the copper paste for pressureless bonding, from the viewpoint of suppressing the time until the dispersion medium is removed at the sintering temperature, and of shortening the sintering time.

The dispersion medium may contain a solvent having a boiling point of lower than 300° C. Examples of the solvent having a boiling point of lower than 300° C. include α-terpineol, diethylene glycol monobutyl ether, diethylene glycol monobutyl ether acetate, 4-methyl-1,3-dioxolan-2-one, and diethylene glycol monobutyl ether. The solvent having a boiling point of lower than 300° C. can be easily removed in a drying step before a sintering step or while a temperature rises. In the dispersion medium, only one type of the solvent having a boiling point of higher than or equal to 300° C. and the solvent having a boiling point of lower than 300° C. may be used, or two or more types thereof may be used by being combined.

The content of the dispersion medium may be 5 parts by mass to 50 parts by mass with respect to 100 parts by mass of the total mass of the metal particles. In a case where the content of the dispersion medium is within the range described above, it is possible to adjust the copper paste for pressureless bonding to have a more suitable viscosity, and it is difficult to inhibit the sintering of the copper particles.

The content of the solvent having a boiling point of higher than or equal to 300° C. in the dispersion medium may be greater than or equal to 20 mass % and less than or equal to 100 mass %, on the basis of the total mass of the dispersion medium. In a case where the content of the solvent having a boiling point of higher than or equal to 300° C. in the dispersion medium is within the range described above, the content of the solvent having a boiling point of higher than or equal to 300° C. with respect to the total mass of the copper paste for pressureless bonding is easily ensured.

The type of dispersion medium contained in the copper paste composition for pressureless bonding, for example, can be analyzed with a gas chromatograph-mass analysis method of high-temperature desorption gas, and TOF-SIMS. As other analysis methods, a supernatant that is obtained by separating a particle component with centrifugal separation may be identified with general organic analysis, for example, FT-IR, NMR, liquid chromatography, and a combination thereof. A ratio of the type of dispersion medium can be quantitatively determined with liquid chromatography, NMR, and the like.

(Additive)

A wetting improver such as a nonionic surfactant and a fluorine-based surfactant; an antifoaming agent such as silicone oil; an ion trapping agent such as an inorganic ion exchanger, and the like may be suitably added to the copper paste for pressureless bonding, as necessary.

In the copper paste for pressureless bonding of this embodiment, it is preferable that the content of the solvent having a boiling point of higher than or equal to 300° C. that remains when the paste is subjected to temperature rising to 300° C. from 25° C. is greater than or equal to 1 mass % on the basis of the mass of the copper paste for pressureless bonding when a temperature rises to 300° C. A temperature rising rate can be set to 9.2 (° C./minute). In this case, it is easy to maintain the flexibility of the copper paste between the members, and even in a case where a shear force due to a thermal expansion rate difference acts at the time of bonding the members having different thermal expansion rates, the copper paste is deformable and followable with respect to the member, and thus, the bonding tends to be rigidly performed. An upper limit of the content of the solvent having a boiling point of higher than or equal to 300° C. that remains when the paste is subjected to temperature rising to 300° C. from 25° C. is not particularly limited, and may be less than or equal to 9 mass % from the viewpoint of suppressing the time until the dispersion medium is removed at the sintering temperature, and of shortening the sintering time.

The copper paste for pressureless bonding of this embodiment is capable of having sufficient flexibility at the time of performing the bonding, and thus, when the copper paste for pressureless bonding that exists between two members is heated at a temperature of higher than or equal to 250° C. and lower than 350° C., it is possible to form metal bonding by sintering the micro copper particles and the sub-micro copper particles, and to bond the two members at a die shear strength of greater than or equal to 10 MPa and a thermal conductivity of greater than or equal to 100 W/(m·K).

Examples of one aspect of the copper paste for pressureless bonding of this embodiment include the copper paste for pressureless bonding in which the metal particles described above include the sub-micro copper particles having a volume average particle diameter of greater than or equal to 0.01 μm and less than or equal to 0.8 μm, and the micro copper particles having a volume average particle diameter of greater than or equal to 2.0 μm and less than or equal to 50 μm, the dispersion medium contains the solvent having a boiling point of higher than or equal to 300° C., and the content of the solvent having a boiling point of higher than or equal to 300° C. is greater than or equal to 2 mass % on the basis of the total mass of the copper paste for pressureless bonding.

Examples of the copper paste for pressureless bonding described above include the copper paste for pressureless bonding in which the sub-micro copper particles having a volume average particle diameter of greater than or equal to 0.01 μm and less than or equal to 0.8 μm, the micro copper particles having a volume average particle diameter of greater than or equal to 2.0 μm and less than or equal to 50 μm, the dispersion medium containing the solvent having a boiling point of higher than or equal to 300° C., and as necessary, the other compounds described above are compounded, and a compounded amount of the solvent having a boiling point of higher than or equal to 300° C. is greater than or equal to 2 mass % on the basis of the total mass of the copper paste for pressureless bonding.

Even in the case of a paste-like composition in which the sub-micro copper particles having sintering properties and the micro copper particles having a stiffening effect are mixed with the dispersion medium having a boiling point of generally lower than 300° C., it is possible to perform the bonding with a high strength insofar as there is no remarkable difference in the thermal expansion rates between the members to be bonded (for example, refer to a die shear strength with respect to an Ni plating Cu plate of Comparative Example 1 in Table 1). However, in a case where such a paste-like composition is used for bonding of the members having different thermal expansion rates, a bonding force easily greatly decreases (for example, refer to a die shear strength with respect to an Ni plating Si chip of Comparative Example 1 in Table 1). It is considered that in a case where the boiling point of the dispersion medium is lower than the bonding temperature, the dispersion medium is evaporated while a temperature rises, a vulnerable composition is obtained in which the paste-like composition is dried before the temperature reaches the bonding temperature, as a factor of a decrease in the bonding force. In such a state, it is considered that in a case where a thermal stress acts on each of the members having different thermal expansion rates, the dried vulnerable composition does not follow the member, and peeling or a crack occurs, and as a result thereof, the bonding force decreases.

The dispersion medium contains the solvent having a boiling point of higher than or equal to 300° C. that is capable of remaining at the bonding temperature, and thus, the solvent having a boiling point of higher than or equal to 300° C. is capable of remaining in the copper paste for pressureless bonding at a content of preferably greater than or equal to 1 mass % while a temperature rises, and therefore, it is possible to apply the flexibility and the adhesive properties to the copper paste for pressureless bonding. For this reason, even in a case where the thermal stress acts on each of the members having different thermal expansion rates at the time of performing the bonding, the copper paste for pressureless bonding is deformable and followable, and it is possible to bond the members together without peeling.

(Preparation of Copper Paste for Pressureless Bonding)

The copper paste for pressureless bonding can be prepared by mixing the sub-micro copper particles, the micro copper particles, the other metal particles, and an arbitrary additive in the solvent having a boiling point of higher than or equal to 300° C. that is the dispersion medium. Each of the components is mixed, and then, a stirring treatment may be performed. In the copper paste for pressureless bonding, a maximum particle diameter of a dispersion liquid may be adjusted by a classification operation. At this time, the maximum particle diameter of the dispersion liquid can be less than or equal to 20 μm, and can be less than or equal to 10 μm.

The copper paste for pressureless bonding may be prepared by mixing in advance the sub-micro copper particles, the surface treatment agent, and the solvent having a boiling point of higher than or equal to 300° C. that is the dispersion medium, by performing a dispersion treatment, by preparing a dispersion liquid of the sub-micro copper particles, and by further mixing the micro copper particles, the other metal particles, and an arbitrary additive. According to such a procedure, the dispersibility of the sub-micro copper particles is improved, mixing properties with respect to the micro copper particles become excellent, and it is possible to further improve the performance of the copper paste for pressureless bonding. In the dispersion liquid of the sub-micro copper particles, an aggregate may be removed by the classification operation.

The stirring treatment can be performed by using a stirrer. Examples of the stirrer include an Ishikawa type stirrer, a Silverson stirrer, a cavitation stirrer, a rotation and revolution type stirring device, an ultra-thin film high-speed rotation type disperser, an ultrasonic disperser, a mortar machine, a biaxial kneader, a bead mill, a ball mill, a triple roll mill, a homomixer, a planetary mixer, an ultrahigh-pressure type disperser, and a thin layer shear disperser.

The classification operation, for example, can be performed by using filtration, spontaneous precipitation, and centrifugal separation. Examples of a filter for filtration include a water comb, a metal mesh, a metal filter, and a nylon mesh.

Examples of the dispersion treatment include a thin layer shear disperser, a bead mill, an ultrasonic homogenizer, a high shear mixer, a narrow gap triple roll mill, a wet type super-atomization device, a supersonic jet mill, and an ultrahigh pressure homogenizer.

In a case where the copper paste for pressureless bonding is molded, the copper paste for pressureless bonding may be adjusted to have a viscosity suitable for each of a printing method and a coating method. For example, a Casson viscosity at 25° C. may be greater than or equal to 0.05 Pa·s and less than or equal to 2.0 Pa·s, or may be greater than or equal to 0.06 Pa·s and less than or equal to 1.0 Pa·s, as the viscosity of the copper paste for pressureless bonding.

<Bonded Body and Semiconductor Device>

Hereinafter, a preferred embodiment will be described in detail with reference to the drawings. Furthermore, in the drawings, the same reference numerals will be applied to the same or the corresponding portions, and the repeated description will be omitted. In addition, a dimensional ratio of the drawings is not limited to the illustrated ratio.

FIG. 1 is a schematic sectional view illustrating an example of the bonded body that is manufactured by using the copper paste for pressureless bonding of this embodiment. A bonded body 100 of this embodiment includes a first member 2, a second member 3 having a thermal expansion rate different from that of the first member, and a sintered body 1 of the copper paste for pressureless bonding described above, the sintered body 1 bonding the first member 2 and the second member 3 together.

Examples of the first member 2 and the second member 3 include a semiconductor element such as an IGBT, a diode, a Schottky barrier diode, MOS-FET, a thyristor, a logic circuit, a sensor, an analog integrated circuit, an LED, a semiconductor laser, and a transmitter, a lead frame, a ceramic substrate with a metal plate (for example, DBC), a base material for mounting a semiconductor element, such as an LED package, a copper ribbon, a metal block, a power feeding member such as a terminal, a heatsink, and a water cooling plate.

The first member 2 and the second member 3 may contain a metal on in surfaces 4a and 4b that are in contact with the sintered body 1 of the copper paste for pressureless bonding. Examples of the metal include copper, nickel, silver, gold, palladium, platinum, lead, tin, and cobalt. Only one type of such metals may be used, or two or more types thereof may be used by being combined. In addition, the surface in contact with the sintered body may contain an alloy including the metals described above. Examples of the metal to be used in the alloy include zinc, manganese, aluminum, beryllium, titanium, chromium, iron, molybdenum, and the like, in addition to the metals described above. Examples of a member containing a metal on a surface in contact with the sintered body include a member including various metal platings, a chip including a wire and metal plating, a heat spreader, a ceramic substrate with a metal plate, a lead frame including various metal platings or a lead frame including various metals, a copper plate, and a copper foil.

A die shear strength of the bonded body may be greater than or equal to 10 MPa, may be greater than or equal to 15 MPa, may be greater than or equal to 20 MPa, or may be greater than or equal to 30 MPa, from the viewpoint of sufficiently bonding the first member and the second member together. The die shear strength can be measured by using a universal bond tester (4000 Series, manufactured by Dage Japan Co., Ltd.) and the like.

A thermal conductivity of the sintered body of the copper paste for pressureless bonding may be greater than or equal to 100 W/(m·K), may be greater than or equal to 120 W/(m·K), or may be greater than or equal to 150 W/(m·K), from the viewpoint of heat releasing properties and connection reliability at a high temperature. The thermal conductivity can be calculated from a thermal diffusion factor, a specific heat capacity, and a density of the sintered body of the copper paste for pressureless bonding.

A difference in the thermal expansion rates between the first member and the second member may be 2 ppm to 30 ppm, may be 3 ppm to 23 ppm, or may be 5 ppm to 15 ppm.

Next, a manufacturing method of the bonded body using the copper paste for pressureless bonding of this embodiment will be described.

The manufacturing method of the bonded body using the copper paste for pressureless bonding of this embodiment includes a step of preparing a laminated body in which the first member, the copper paste for pressureless bonding, and the second member having a thermal expansion rate different from that of the first member are laminated in this order in a direction side in which self-weight of the first member acts, and of sintering the copper paste for pressureless bonding in a state of receiving the self-weight of the first member, the self-weight of the first member and a pressure of less than or equal to 0.01 MPa. The direction in which the self-weight of the first member acts can also be referred to as a direction in which gravity acts.

The laminated body described above, for example, can be prepared by providing the copper paste for pressureless bonding of this embodiment in a necessary portion of the second member, and then, by arranging the first member on the copper paste for pressureless bonding.

A method of providing the copper paste for pressureless bonding of this embodiment in the necessary portion of the second member may be a method of depositing the copper paste for pressureless bonding. For example, screen printing, transfer printing, offset printing, a jet printing method, a dispenser, a jet dispenser, a needle dispenser, a comma coater, a slit coater, a die coater, a gravure coater, slit coating, anastatic printing, intaglio printing, gravure printing, stencil printing, soft lithography, a bar coater, an applicator, a particle deposition method, a spray coater, a spin coater, a dip coater, electrodeposition coating, and the like can be used as the method. The thickness of the copper paste for pressureless bonding may be greater than or equal to 1 µm and less than or equal to 1000 µm, may be greater than or equal to 10 µm and less than or equal to 500 µm, may be greater than or equal to 50 µm and less than or equal to 200 µm, may be greater than or equal to 10 µm and less than or equal to 3000 µm, may be greater than or equal to 15 µm and less than or equal to 500 µm, may be greater than or equal to 20 µm and less than or equal to 300 µm, may be greater than or equal to 5 µm and less than or equal to 500 µm, may be greater than or equal to 10 µm and less than or equal to 250 µm, or may be greater than or equal to 15 µm and less than or equal to 150 µm.

The copper paste for pressureless bonding provided on the second member may be suitably dried from the viewpoint of preventing a flux and a void from being generated at the time of performing the sintering. A gas atmosphere at the time of performing drying may be the atmospheric air, may be an oxygen-free atmosphere of nitrogen, rare gas, or the like, or may be a reduction atmosphere of hydrogen, a formic acid, or the like. In a drying method, drying may be performed after being left to stand at normal temperature, heating drying may be performed, or reduced-pressure drying may be performed. In the heating drying or the reduced-pressure drying, for example, a hot plate, a hot air dryer, a hot air heating furnace, a nitrogen dryer, an infrared ray dryer, an infrared ray heating furnace, a far-infrared ray heating furnace, a microwave heating device, a laser heating device, an electromagnetic heating device, a heater heating device, a vapor heating furnace, a hot plate pressing device, and the like can be used. A drying temperature and a drying time may be suitably adjusted in accordance with the type and the amount of the dispersion medium that is used. The drying, for example, may be performed at a temperature of higher than or equal to 50° C. and lower than or equal to 180° C. and for a time of longer than or equal to 1 minute and shorter than or equal to 120 minutes, as the drying temperature and the drying time.

Examples of a method of arranging the first member on the copper paste for pressureless bonding include a chip mounter, a flip-chip bonder, and a carbon or ceramic positioning jig.

The laminated body is subjected to a heating treatment, and thus, the copper paste for pressureless bonding is sintered. In the heating treatment, for example, a hot plate, a hot air dryer, a hot air heating furnace, a nitrogen dryer, an infrared ray dryer, an infrared ray heating furnace, a far-infrared ray heating furnace, a microwave heating device, a laser heating device, an electromagnetic heating device, a heater heating device, a vapor heating furnace, and the like can be used.

The gas atmosphere at the time of performing the sintering may be an oxygen-free atmosphere from the viewpoint of suppressing the oxidation of the sintered body, the first member, and the second member. The gas atmosphere at the time of performing the sintering may be a reduction atmosphere from the viewpoint of removing a surface oxide of the copper particles in the copper paste for pressureless bonding. Examples of the oxygen-free atmosphere include an atmosphere into which oxygen-free gas such as nitrogen and rare gas is introduced, or vacuum. Examples of the reduction atmosphere include a pure hydrogen gas atmosphere, a mixed gas atmosphere of hydrogen and nitrogen that are represented by forming gas, a nitrogen atmosphere containing formic acid gas, a mixed gas atmosphere of hydrogen and rare gas, and a rare gas atmosphere containing formic acid gas.

A highest achieving temperature at the time of performing the heating treatment may be higher than or equal to 250° C. and lower than or equal to 450° C., may be higher than or equal to 250° C. and lower than or equal to 400° C., or may be higher than or equal to 250° C. and lower than or equal to 350° C., from the viewpoint of enabling a thermal damage with respect to the first member and the second member to be reduced and of improving a yield ratio. In a case where the highest achieving temperature is higher than or equal to 200° C., the sintering tends to be sufficiently performed for a highest achieving temperature retention time of shorter than or equal to 60 minutes.

The highest achieving temperature retention time may be longer than or equal to 1 minute and shorter than or equal to 60 minutes, may be longer than or equal to 1 minute and shorter than 40 minutes, or may be longer than or equal to 1 minute and shorter than 30 minutes, from the viewpoint of sufficiently volatilizing the dispersion medium, and of improving the yield ratio.

Even in a case where the bonding is performed without a pressure at the time of sintering the laminated body, the bonded body is capable of having a sufficient bonding strength by using the copper paste for pressureless bonding of this embodiment. That is, it is possible to obtain a sufficient bonding strength in a state of receiving only the self-weight of the first member that is laminated on the copper paste for pressureless bonding, or in a state of receiving a pressure of less than or equal to 0.01 MPa, preferably less than or equal to 0.005 MPa, in addition to the self-weight of the first member. In a case where a pressure that is received at the time of performing the sintering is within the range described above, a special pressurization device is not necessary, and thus, it is possible to reduce the void, and to further improve the die shear strength and the connection reliability without impairing the yield ratio. Examples of a method of receiving the pressure of less than or equal to 0.01 MPa in the copper paste for pressureless bonding include a method of placing a weight on the first member.

In the bonded body described above, at least one of the first member and the second member may be the semiconductor element. Examples of the semiconductor element include a power module such as a diode, a rectifier, a thyristor, a MOS gate driver, a power switch, a power MOSFET, IGBT, a Schottky diode, and a fast recovery diode, a transmitter, an amplifier, an LED module, and the like. In such a case, the bonded body described above is a semiconductor device. The semiconductor device to be obtained is capable of having a sufficient die shear strength and sufficient connection reliability.

In the semiconductor device, a difference in the thermal expansion rates between the first member and the second member, a difference in the thermal expansion rates between the first member and the second member may be 2 ppm to 30 ppm, may be 3 ppm to 23 ppm, or may be 5 ppm to 15 ppm.

Figure 2:
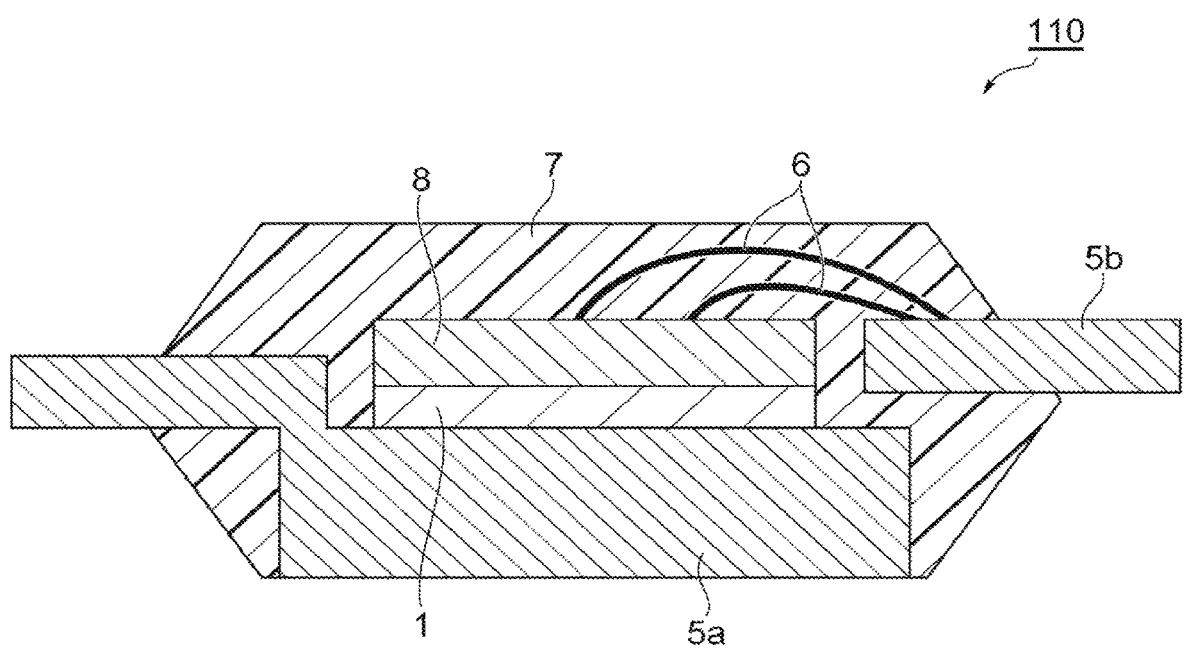
FIG. 2 is a schematic sectional view illustrating an example of a semiconductor device that is manufactured by using the copper paste for pressureless bonding of this embodiment.

FIG. 2 is a schematic sectional view illustrating an example of the semiconductor device that is manufactured by using the copper paste for pressureless bonding of this embodiment. A semiconductor device 110 illustrated in FIG. 2 includes a semiconductor element 8 that is connected through the sintered body 1 of the copper paste for pressureless bonding according to this embodiment, and a mold resin 7 for molding the copper paste for pressureless bonding, on a lead frame 5a. The semiconductor element 8 is connected to a lead frame 5b through a wire 6.

Examples of the semiconductor device that is manufactured by using the copper paste for pressureless bonding of this embodiment include a power module such as a diode, a rectifier, a thyristor, a MOS gate driver, a power switch, a power MOSFET, IGBT, a Schottky diode, and a fast recovery diode, a transmitter, an amplifier, a high-intensity LED module, a semiconductor laser module, logic, a sensor, and the like.

The semiconductor device described above can be manufactured as with the manufacturing method of the bonded body described above. That is, a manufacturing method of the semiconductor device includes a step of preparing the laminated body in which the first member, the copper paste for pressureless bonding described above, and the second member are laminated in this order in the direction side in which the self-weight of the first member acts by using the semiconductor element in at least one of the first member and the second member, of sintering the copper paste for pressureless bonding in a state of receiving the self-weight of the first member, or in a state of receiving the self-weight of the first member and a pressure of less than or equal to 0.01 MPa. For example, a step of providing the copper paste for pressureless bonding on the lead frame 5a, and of arranging and heating the semiconductor element 8 is provided. Even in a case where the bonding is performed without a pressure, the semiconductor device to be obtained is capable of having a sufficient die shear strength and sufficient connection reliability. The semiconductor device of this embodiment includes a copper sintered body that has a sufficient bonding force, and a high thermal conductivity and a high melting point, and thus, the semiconductor device is capable of having a sufficient die shear strength, can be excellent in the connection reliability, and can also be excellent in power cycle resistance.

EXAMPLES

Example 1

(Preparation of Copper Paste for Pressureless Bonding)
15.84 g (52.8 mass %) of CH-0200 (a 50% volume average particle diameter of 0.36 µm, manufactured by MITSUI MINING & SMELTING CO., LTD.) as the submicro copper particles, and 3.6 g (12 mass %) of isobornyl cyclohexanol (a boiling point of 308° C., hereinafter, simply referred to as MTPH) as the solvent having a boiling point of higher than or equal to 300° C. were weighed, and were mixed by an automatic mortar for 5 minutes. Further, the mixture was subjected to a dispersion treatment by an ultrasonic homogenizer (US-600, manufactured by NIPPON SEIKI CO., LTD.) at 19.6 kHz and 600 W for 10 minutes.

The mixture subjected to the dispersion treatment was moved to a polyethylene bottle, 10.56 g (35.2 mass %) of MA-C025KFD (a 50% volume average particle diameter of 5 µm, manufactured by MITSUI MINING & SMELTING CO., LTD.) as the micro copper particles was weighed and added, and was put into a stirrer, manufactured by Thinky Corporation (Awatori Rentaro ARE-310), in a reduced-pressure condition at 2000 rpm for 2 minutes, and thus, a copper paste for pressureless bonding was obtained.

(Solid Content Measurement)

The copper paste for pressureless bonding was put into a magnetic crucible, and the weight of the copper paste for pressureless bonding was obtained from a difference between a tare weight of the magnetic crucible and the weight of the magnetic crucible into which the copper paste for pressureless bonding was put. The magnetic crucible into which the copper paste for pressureless bonding was put was provided in a muffle furnace that was heated to 600° C., and was treated for 1 hour. The weight of a non-volatile content in the copper paste for pressureless bonding was obtained from a difference between the weight of the crucible after the treatment and the tare weight of the magnetic crucible. A solid content (mass %) of the copper paste for pressureless bonding was calculated from the following expression.

Solid Content (mass %) of Copper Paste for Pressureless Bonding={(Weight of Non-Volatile Content of Copper Paste for Pressureless Bonding)/(Weight of Copper Paste for Pressureless Bonding before Heating)}×100

(Measurement of Remaining Solvent Ratio)

When a temperature rose to 300° C. from a room temperature (25° C.), a ratio of the dispersion medium remaining in the copper paste for pressureless bonding (a remaining solvent ratio) was measured. The mass of a copper plate and a chip was measured, and then, the copper paste for pressureless bonding was printed on the copper plate, and the chip was mounted thereon, and thus, a laminated body was obtained. In such a stage, the mass of the laminated body was measured. The laminated body was subjected to temperature rising to 300° C. from 25° C. for 30 minutes in an oven under nitrogen, and then, the laminated body was taken out, and was rapidly cooled on a brass block. The mass of the laminated body after the cooling was measured, and was set to a mass when a temperature reached 300° C. A remaining solvent ratio when a temperature reached 300° C. was calculated from the following expression.

$$\text{Remaining Solvent Ratio(\%) When Temperature Reaches 300° C.} = \frac{\left(\begin{array}{c}\text{Remaining Amount of Solvent in Paste} \\ \text{When Temperature Reaches 300° C.}\end{array}\right)}{\left(\begin{array}{c}\text{Mass of Paste} \\ \text{When Temperature Reaches 300° C.}\end{array}\right)} \times 100 =$$

$$\frac{\left(\left(\begin{array}{c}\text{Mass of Paste} \\ \text{When Temperature Reaches 300° C.}\end{array}\right) - \left(\begin{array}{c}\text{Mass of Metal Particles in Paste} \\ \text{When Temperature Reaches 300° C.}\end{array}\right)\right)}{\left(\begin{array}{c}\text{Mass of} \\ \text{Paste When Temperature Reaches 300° C.}\end{array}\right)} \times 100 =$$

$$\frac{\left\{\left(\begin{array}{c}\text{Mass of} \\ \text{Laminated Body} \\ \text{When Temperature} \\ \text{Reaches 300° C.}\end{array}\right) - \left(\begin{array}{c}\text{Mass of} \\ \text{Copper Plate} \\ \text{and Chip}\end{array}\right)\right\} -}{(\text{Mass of Laminated Body When Temperature Reaches 300° C.})} -$$

$$\frac{\left\{\left(\begin{array}{c}\text{Mass of} \\ \text{Laminated Body} \\ \text{before Heating}\end{array}\right) - \left(\begin{array}{c}\text{Mass of} \\ \text{Copper Plate} \\ \text{and Chip}\end{array}\right)\right\} - \left(\frac{\text{Solid}}{\text{Content}}{100}\right)}{(\text{Mass of Copper Plate and Chip})} \times 100$$

(Preparation of Bonding Sample for Die Shear Strength Test)

(Bonding Sample Using Si Chip)

The copper paste for pressureless bonding was subjected to stencil printing on a copper plate having a size of 25×20×Thickness of 3 mm by using a stainless steel mask having a square opening of 3×3 mm² and a thickness of 75 µm and a squeegee. An Si chip (a nickel-covered surface) in which Titanium/Nickel were sputtered in this order on the entire bonding surface having a thickness of 400 µm and a size of 3 mm×3 mm on a printed matter of the copper paste for pressureless bonding was provided such that the nickel surface was in contact with the copper paste composition for pressureless bonding, and the chip was slightly pressed by tweezers, and thus, the nickel surface adhered to the copper paste for pressureless bonding. The adherend was provided in a tubular furnace, and the inside was substituted with argon gas, and then, hydrogen was introduced, a temperature rose for 30 minutes, and the sintering was performed in a condition of 300° C. and 10 minutes. After that, the introduction of hydrogen was stopped, cooling was performed to a temperature of lower than or equal to 50° C. under an argon airstream, and a bonding sample was taken out in the air.

(Bonding Sample Using Cu Plate)

A bonding sample was prepared as described above, except that a Cu plate (a nickel covered surface) of which the entire surface having a thickness of 250 µm and a size of 2 mm×2 mm was plated with nickel was used.

(Die Shear Strength Test)

A bonding strength of a die strength sample was evaluated by a die shear strength. A die shear strength of the bonding sample was measured by using a universal bond tester provided with a DS-100 load cell (4000 Series, manufactured by Dage Japan Co., Ltd.), and by pressing the Si chip or the Cu plate in a horizontal direction at a measurement speed of 5 mm/min and a measurement height of 50 µm. A die shear strength of greater than or equal to 20 MPa was evaluated as excellent bonding.

Comparative Example 1

A copper paste for pressureless bonding was obtained as with Example 1, except that 9.0 parts by mass of α-terpineol (a boiling point of 220° C.) was used without using isobornyl cyclohexanol. A die shear strength was measured as with Example 1, except that such a copper paste for pressureless bonding was used. The results are shown in Table 1.

TABLE 1

| Test | Solid content (mass %) | Remaining solvent ratio (mass %) when temperature reaches 300° C. | Die shear strength (MPa) with respect to Ni sputtering Si chip | Die shear strength (MPa) with respect to Ni plating Cu plate |
|---|---|---|---|---|
| Example 1 | 87.8 | 1.2 | 31 | 31 |
| Comparative Example 1 | 87.9 | 0.3 | 9 | 28 |

In a sample of Example 1 in which a part of the dispersion medium was set to MTPH having a boiling point of 308° C., an excellent die shear strength of 31 MPa was exhibited with respect to the Si chip. On the other hand, in a sample of Comparative Example 1 using the copper paste for pressureless bonding not containing the solvent having a boiling point of higher than or equal to 300° C., a die shear strength with respect to the Si chip was 9 MPa, and thus, a bonding defect occurred.

In a case where the remaining solvent ratio was measured, in Example 1, 1.2 mass % of the solvent remained even when a temperature reached 300° C. Such a content is 10 volume % in the volume, and it is considered that the remaining solvent applies flexibility and adhesiveness for enabling the displacement of the copper paste for pressureless bonding due to a thermal expansion rate difference between the copper plate and the Si chip to be sufficiently absorbed to the copper paste for pressureless bonding. On the other hand, in Comparative Example 1, the content of the solvent remaining when a temperature reached 300° C. was 0.3 mass %, and was 3 volume % in the volume. For this reason, in the copper paste for pressureless bonding of Comparative Example 1, it is considered that a sufficient solvent does not exist between the particles, and the copper paste for pressureless bonding is peeled off from the chip by the displacement due to a thermal expansion rate difference, and thus, the die shear strength decreases.

Figure 3:
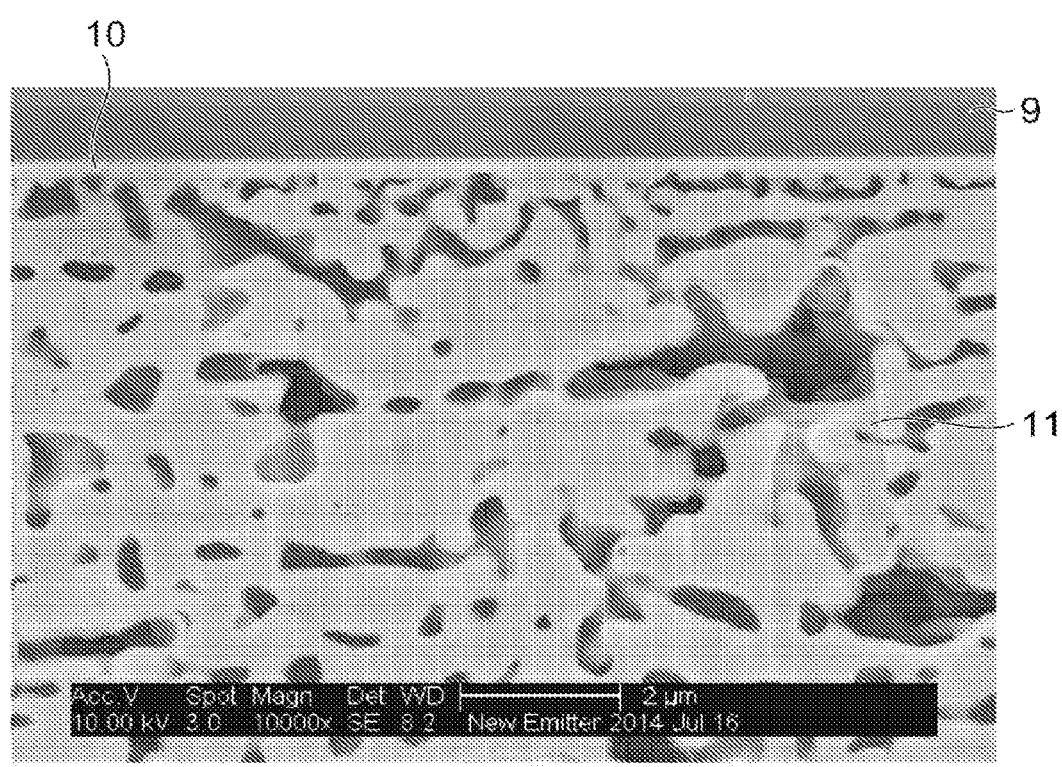
FIG. 3 is a diagram illustrating an SEM image of a sectional surface of a bonding sample of Example 1.
Figure 4:
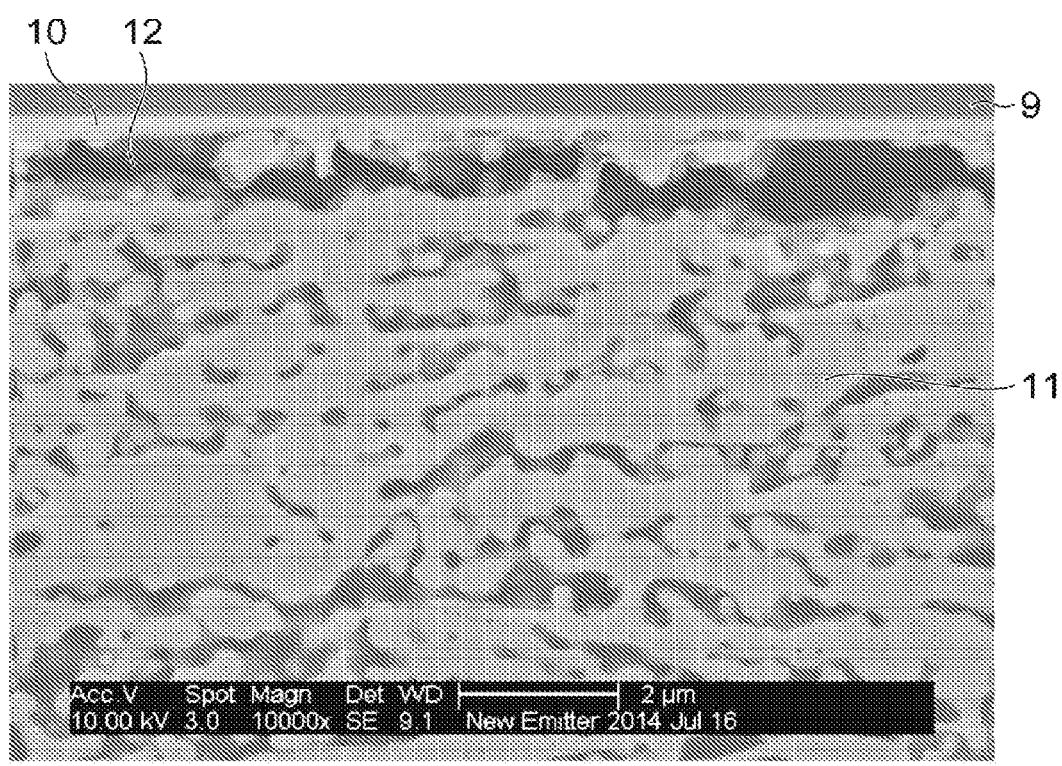
FIG. 4 is a diagram illustrating an SEM image of a sectional surface of a bonding sample of Comparative Example 1.

A sectional SEM image of an interface between Si Chip/Die Bonding Layer of a die bonding portion in which the copper substrate and the Si chip were bonded together was observed. A test sample that was used for observing the SEM image was prepared in (Preparation of Bonding Sample for Die Shear Strength Test). A sectional SEM image of Example 1 is illustrated in FIG. 3, and a sectional SEM image of Comparative Example 1 is illustrated in FIG. 4. In a sample of Example 1, a silicon chip 9 including a Ti/Ni plating layer 10, and a sintered body 11 of the copper paste for pressureless bonding were excellently bonded together. On the other hand, in a sample of Comparative Example 1, a peeling portion (a crack) 12 was generated between the silicon chip 9 including the Ti/Ni plating layer 10, and the sintered body 11 of the copper paste for pressureless bonding, and thus, a bonding defect occurred. It is considered that this is because the peeling occurs on the interface between Si Chip/Die Bonding Layer before the bonding by the displacement due to a difference in the thermal expansion rates between the copper substrate and the Si chip.

Examples 2 to 5 and Comparative Example 2

(Preparation of Copper Paste Composition)

Isobornyl cyclohexanol (a boiling point of 308° C., hereinafter, simply referred to as MTPH) as the solvent having a boiling point of higher than or equal to 300° C., and α-terpineol (a boiling point of 220° C.) as other solvents were mixed in accordance with ratios in Table 2. In addition, 10.56 g (35.2 mass %) of MA-C025KFD (a 50% volume average particle diameter of 5 µm, manufactured by MITSUI MINING & SMELTING CO., LTD.) as the micro copper particles, and 15.84 g (52.8 mass %) of CH-0200 (a 50% volume average particle diameter of 0.36 µm, manufactured by MITSUI MINING & SMELTING CO., LTD.) as the sub-micro copper particles were weighed, and were mixed in an automatic mortar for 5 minutes. The mixture was moved to a polyethylene bottle, and then, was put into a stirrer, manufactured by Thinky Corporation (Awatori Rentaro ARE-310), in a reduced-pressure condition at 2000 rpm for 2 minutes, and thus, a copper paste composition for pressureless bonding was obtained.

(Preparation of Die Shear Test Sample)

Figure 5:
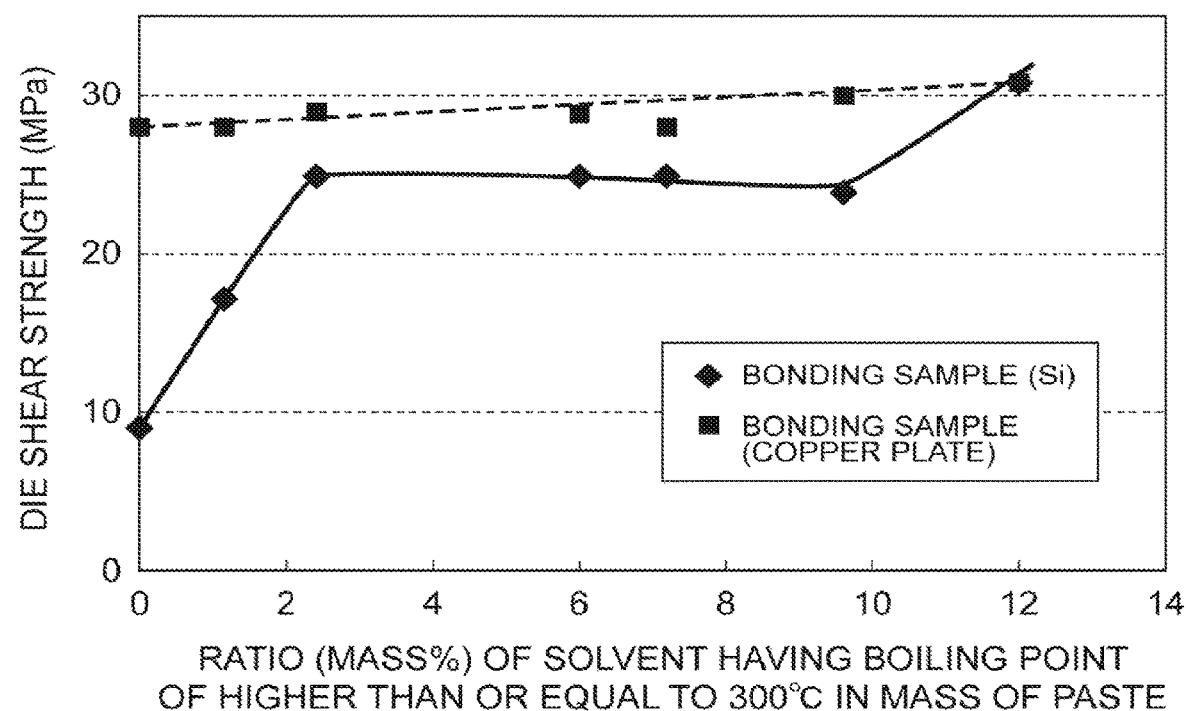
FIG. 5 is a diagram illustrating a relationship between a ratio of a solvent having a boiling point of higher than or equal to 300° C. to the copper paste for pressureless bonding, and a die shear strength.

A bonding sample (Si) using an Si chip in which Titanium/Nickel were sputtered in this order on the entire bonding surface having a size of 3 mm×3 mm was prepared as with Example 1. Further, a bonding sample (a copper plate) bonded as with Example 1 was prepared by using a copper plate in which the entire surface having a size of 2 mm×2 mm was plated with nickel. A die shear strength was measured with respect to each of the bonding samples, as with Example 1. The results are shown in Table 2 and FIG. 5.

TABLE 2

| | | Example 1 | Example 2 | Example 3 | Example 4 | Example 5 | Comparative Example 2 | Comparative Example 1 |
|---|---|---|---|---|---|---|---|---|
| Solvent having boiling point of higher than or equal to 300° C. | Type | MTPH | MTPH | MTPH | MTPH | MTPH | MTPH | — |
| | Boiling point (° C.) | 308 | 308 | 308 | 308 | 308 | 308 | — |
| | Content (mass %) in total mass of paste | 12 | 9.6 | 7.2 | 6.0 | 2.4 | 1.2 | 0 |
| Other solvents | Type | — | α-Terpineol | α-Terpineol | α-Terpineol | α-Terpineol | α-Terpineol | α-Terpineol |
| | Boiling point (° C.) | — | 220 | 220 | 220 | 220 | 220 | 220 |
| | Content (mass %) in total mass of paste | 0 | 2.4 | 4.8 | 6.0 | 9.6 | 10.8 | 12 |
| Micro copper particles | Type | MA-C025KFD | MA-C025KFD | MA-C025KFD | MA-C025KFD | MA-C025KFD | MA-C025KFD | MA-C025KFD |
| | Content (mass %) in total mass of paste | 26.4 | 26.4 | 26.4 | 26.4 | 26.4 | 26.4 | 26.4 |
| Sub-micro copper particles | Type | CH-0200 | CH-0200 | CH-0200 | CH-0200 | CH-0200 | CH-0200 | CH-0200 |
| | Content (mass %) in total mass of paste | 61.6 | 61.6 | 61.6 | 61.6 | 61.6 | 61.6 | 61.6 |
| Die shear strength (MPa) | Bonding sample (Si) | 31 | 24 | 25 | 25 | 25 | 17 | 9 |
| | Bonding sample (copper plate) | 31 | 30 | 28 | 29 | 29 | 28 | 28 |

Example 6

A copper paste for pressureless bonding was prepared as with Example 1, except that tributyrin (a boiling point of 310° C.) was used as the solvent having a boiling point of higher than or equal to 300° C. A bonding sample (Si) using an Si chip in which Titanium/Nickel were sputtered in this order on the entire bonding surface having a size of 3 mm×3 mm was prepared as with Example 1, except that such a copper paste for pressureless bonding was used, and a die shear strength was measured. As a result thereof, the die shear strength represented an excellent value of 20 MPa.

Example 7

A copper paste for pressureless bonding was prepared as with Example 1, except that FINEOXOCOL 180 (isooctadecanol, a boiling point of 302° C., manufactured by Nissan Chemical Corporation) was used as the solvent having a boiling point of higher than or equal to 300° C. A bonding sample (Si) using an Si chip in which Titanium/Nickel were sputtered in this order on the entire bonding surface having a size of 3 mm×3 mm was prepared as with Example 1 except that such a copper paste for pressureless bonding was used, and a die shear strength was measured. As a result thereof, the die shear strength represented an excellent value of 23 MPa.

Example 8

A copper paste for pressureless bonding was prepared as with Example 1, except that butyl stearate (a boiling point of 343° C.) was used as the solvent having a boiling point of higher than or equal to 300° C. A bonding sample (Si) using an Si chip in which Titanium/Nickel were sputtered in this order on the entire bonding surface having a size of 3 mm×3 mm was prepared as with Example 1, except that such a copper paste for pressureless bonding was used, and a die shear strength was measured. As a result thereof, the die shear strength represented an excellent value of 25 MPa.

Example 9

A copper paste for pressureless bonding was prepared as with Example 1, except that octyl octanoate (a boiling point of 311° C.) was used as the solvent composition having a boiling point of higher than or equal to 300° C. A bonding sample (Si) using an Si chip in which Titanium/Nickel were sputtered in this order on the entire bonding surface having a size of 3 mm×3 mm was prepared as with Example 1, except that such a copper paste for pressureless bonding was used, and a die shear strength was measured. As a result thereof, the die shear strength represented an excellent value of 26 MPa.

Comparative Example 3

A copper paste for pressureless bonding was prepared as with Example 1, except that diethylene glycol monobutyl ether (a boiling point of 230° C., hereinafter, simply referred to as DEGBE) was used as the dispersion medium. A bonding sample (Si) using an Si chip in which Titanium/Nickel were sputtered in this order on the entire bonding surface having a size of 3 mm×3 mm was prepared as with Example 1, except that such a copper paste for pressureless bonding was used, and a die shear strength was measured. As a result thereof, the die shear strength was 6 MPa, and was determined as a connection defect.

Comparative Example 4

A copper paste for pressureless bonding was prepared as with Example 1, except that diethylene glycol monobutyl ether acetate (a boiling point of 247° C., hereinafter, simply referred to as BDGAC) was used as the dispersion medium. A bonding sample (Si) using an Si chip in which Titanium/Nickel were sputtered in this order on the entire bonding surface having a size of 3 mm×3 mm was prepared as with Example 1, except that such a copper paste for pressureless bonding was used, and a die shear strength was measured. As a result thereof, the die shear strength was 5 MPa, and was determined as a connection defect.

Figure 6:
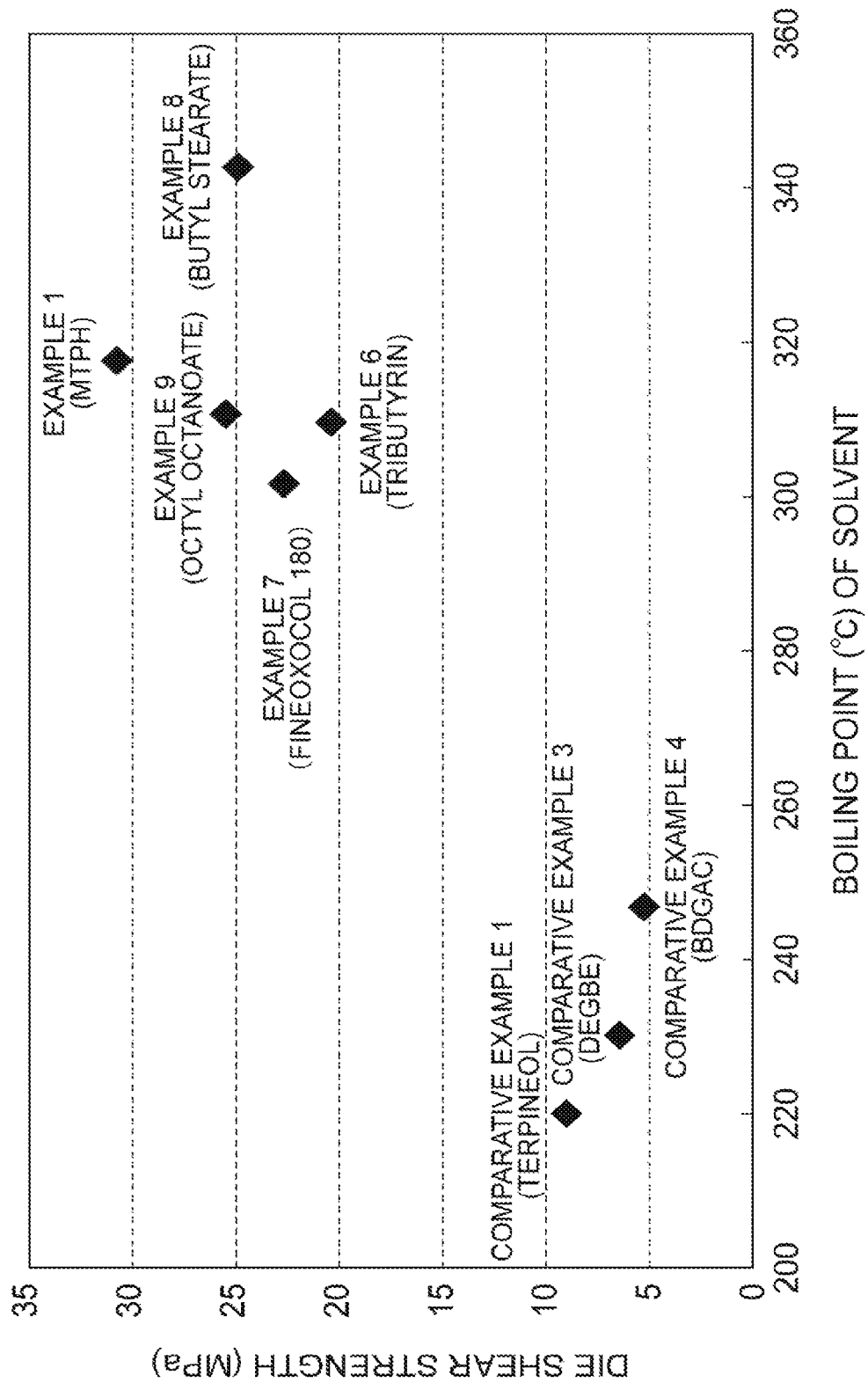
FIG. 6 is a diagram illustrating a relationship between a boiling point of a dispersion medium and a die shear strength.

The results of Examples 6 to 9 and Comparative Examples 3 and 4 are shown in Table 3. In FIG. 6, the die shear strength of the bonding sample (Si) using the copper paste for pressureless bonding of Examples 1, 6, 7, 8, and 9, and Comparative Examples 1, 3, and 4 was plotted with respect to the boiling point of the solvent. In all of the examples using the solvent having a boiling point of higher than or equal to 300° C., an excellent die shear strength of greater than or equal to 20 MPa was obtained. On the other hand, in all of the comparative examples using the solvent having a boiling point of lower than 300° C., a low die shear strength of less than or equal to 9 MPa was obtained, and thus, a bonding defect occurred.

TABLE 3

| | | Example 1 | Example 6 | Example 7 | Example 8 | Example 9 | Comparative Example 1 | Comparative Example 3 | Comparative Example 4 |
|---|---|---|---|---|---|---|---|---|---|
| Dispersion medium | Type | MTPH | Tributyrin | FINEOXOCOL 180 | Butyl stearate | Octyl octanoate | α-Terpineol | DEGBE | BDGAC |
| | Boiling point (° C.) | 308 | 310 | 302 | 343 | 311 | 220 | 230 | 247 |
| | Content (mass %) in total mass of paste | 12 | 12 | 12 | 12 | 12 | 12 | 12 | 12 |
| Micro copper particles | Type | MA-C025KFD | MA-C025KFD | MA-C025KFD | MA-C025KFD | MA-C025KFD | MA-C025KFD | MA-C025KFD | MA-C025KFD |
| | Content (mass %) in total mass of paste | 26.4 | 26.4 | 26.4 | 26.4 | 26.4 | 26.4 | 26.4 | 26.4 |
| Sub-micro copper particles | Type | CH-0200 | CH-0200 | CH-0200 | CH-0200 | CH-0200 | CH-0200 | CH-0200 | CH-0200 |
| | Content (mass %) in total mass of paste | 61.6 | 61.6 | 61.6 | 61.6 | 61.6 | 61.6 | 61.6 | 61.6 |

TABLE 3-continued

|  |  | Example 1 | Example 6 | Example 7 | Example 8 | Example 9 | Comparative Example 1 | Comparative Example 3 | Comparative Example 4 |
|---|---|---|---|---|---|---|---|---|---|
| Die shear strength (MPa) | Bonding sample (Si) | 31 | 20 | 23 | 25 | 26 | 9 | 6 | 5 |

REFERENCE SIGNS LIST

1: sintered body of copper paste for pressureless bonding, 2: first member, 3: second member, 5a, 5b: lead frame, 6: wire, 7: mold resin, 8: semiconductor element, 9: silicon chip, 10: Ti/Ni plating layer, 11: sintered body of copper paste for pressureless bonding, 12: peeling portion.

The invention claimed is:

1. A paste for pressureless bonding, containing:
   metal particles; and
   a dispersion medium,
   wherein the dispersion medium contains a solvent having a boiling point of higher than or equal to 300° C., and a content of the solvent having a boiling point of higher than or equal to 300° C. is greater than or equal to 2 mass % on the basis of a total mass of the copper paste for pressureless bonding, and the solvent having a boiling point of higher than or equal to 300° C. has at least one type of group selected from the group consisting of a hydroxy group, an ether group, and an ester group.

2. The paste for pressureless bonding according to claim 1,
   wherein the content of the solvent having a boiling point of higher than or equal to 300° C. that remains when a temperature rises to 300° C. from 25° C. is greater than or equal to 1 mass % on the basis of a mass of the paste for pressureless bonding when a temperature rises to 300° C.

3. A bonded body, comprising:
   a first member;
   a second member having a thermal expansion rate different from that of the first member; and
   a sintered body of the paste for pressureless bonding according to claim 1, the sintered body bonding the first member and the second member together.

4. A manufacturing method of a bonded body, comprising:
   a step of preparing a laminated body in which a first member, the paste for pressureless bonding according to claim 1, and a second member having a thermal expansion rate different from that of the first member are laminated in this order in a direction side in which self-weight of the first member acts, and of sintering the paste for pressureless bonding in a state of receiving the self-weight of the first member, or the self-weight of the first member and a pressure of less than or equal to 0.01 MPa.

5. A semiconductor device, comprising:
   a first member;
   a second member having a thermal expansion rate different from that of the first member; and
   a sintered body of the paste for pressureless bonding according to claim 1, the sintered body bonding the first member and the second member together,
   wherein at least one of the first member and the second member is a semiconductor element.

6. A copper paste for pressureless bonding, containing:
   metal particles; and
   a dispersion medium,
   wherein the dispersion medium contains a solvent having a boiling point of higher than or equal to 300° C., and a content of the solvent having a boiling point of higher than or equal to 300° C. is greater than or equal to 8 volume % on the basis of a total volume of the paste for pressureless bonding, and the solvent having a boiling point of higher than or equal to 300° C. has at least one type of group selected from the group consisting of a hydroxy group, an ether group, and an ester group.

7. The paste for pressureless bonding according to claim 2,
   wherein the content of the solvent having a boiling point of higher than or equal to 300° C. that remains when a temperature rises to 300° C. from 25° C. is greater than or equal to 1 mass % on the basis of a mass of the paste for pressureless bonding when a temperature rises to 300° C.

* * * * *